US012666969B2

(12) United States Patent
Kim

(10) Patent No.: US 12,666,969 B2
(45) Date of Patent: Jun. 23, 2026

(54) SEMICONDUCTOR PACKAGE

(71) Applicant: SAMSUNG ELECTRONICS CO., LTD., Suwon-si (KR)

(72) Inventor: Geunwoo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 18/380,928

(22) Filed: Oct. 17, 2023

(65) Prior Publication Data

US 2024/0136307 A1 Apr. 25, 2024
US 2024/0234342 A9 Jul. 11, 2024

(30) Foreign Application Priority Data

Oct. 19, 2022 (KR) ........................ 10-2022-0135228

(51) Int. Cl.
*H10W 72/90* (2026.01)
*H10W 42/00* (2026.01)
*H10W 70/65* (2026.01)
*H10W 72/20* (2026.01)
*H10W 72/29* (2026.01)
*H10W 90/00* (2026.01)

(52) U.S. Cl.
CPC ......... *H10W 42/121* (2026.01); *H10W 70/65* (2026.01); *H10W 72/90* (2026.01); *H10W 72/263* (2026.01); *H10W 72/267* (2026.01); *H10W 72/29* (2026.01); *H10W 72/963* (2026.01); *H10W 72/967* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 7,030,487 | B1* | 4/2006 | Keng ................... | H01L 23/3128 |
| | | | | 257/E23.101 |
| 7,787,252 | B2* | 8/2010 | Mertol ................... | H01L 23/055 |
| | | | | 257/713 |
| 8,525,333 | B2* | 9/2013 | Kanetaka .......... | H01L 23/49816 |
| | | | | 257/737 |
| 9,318,458 | B2 | 4/2016 | Chang et al. | |
| 9,437,551 | B2 | 9/2016 | Cheng et al. | |
| 10,276,548 | B2* | 4/2019 | Chen ..................... | H01L 25/105 |
| 11,304,290 | B2 | 4/2022 | Yu | |
| 2012/0306102 | A1* | 12/2012 | Cho ................... | H01L 23/49833 |
| | | | | 257/E23.116 |
| 2020/0194330 | A1 | 6/2020 | Ramanathan et al. | |
| 2020/0194331 | A1* | 6/2020 | Kim ................... | H01L 23/3677 |

(Continued)

*Primary Examiner* — Nishath Yasmeen
(74) *Attorney, Agent, or Firm* — Sughrue Mion, PLLC

(57) ABSTRACT

A semiconductor package includes a semiconductor chip including a semiconductor substrate having a first surface and a second surface opposite to the first surface, a chip pad located on the first surface and including a conductive layer, a support pad positioned on the first surface, spaced apart from the chip pad and including an insulating layer, a support bump connected to the support pad, a wiring substrate disposed to face the semiconductor substrate, a support bonding on trace (BOT) pad disposed on the wiring substrate and bonded to the support bump, and a dummy area disposed on the wiring substrate and spaced apart from the support BOT pad.

20 Claims, 18 Drawing Sheets

PO1

(56) References Cited

U.S. PATENT DOCUMENTS

| | | | |
|---|---|---|---|
| 2021/0066176 | A1 | 3/2021 | Shinkai |
| 2022/0068871 | A1 | 3/2022 | Kim |
| 2022/0165698 | A1 | 5/2022 | Kim et al. |

* cited by examiner

PO1

PO1-1

PO3

PO2-4

PO2c

PK2

SEMICONDUCTOR PACKAGE

CROSS-REFERENCE TO RELATED APPLICATION

This application is based on and claims priority under 35 U.S.C. § 119 to Korean Patent Application No. 10-2022-0135228, filed on Oct. 19, 2022, in the Korean Intellectual Property Office, the disclosure of which is incorporated by reference herein in its entirety.

BACKGROUND

The present disclosure relates to a semiconductor package, and more particularly, to a semiconductor package in which bumps of a semiconductor chip are bonded to pads of a wiring substrate.

A laser assisted bonding device may bond a semiconductor chip to a wiring substrate by transferring heat to the semiconductor chip through a laser beam.

If the temperature applied to the semiconductor chip through a laser beam is high, warpage of the semiconductor chip may increase, and accordingly, the semiconductor chip may not operate as desired. In addition, as the warpage of the semiconductor chip increases, the semiconductor chip and the wiring substrate may not be bonded to each other.

SUMMARY

It is an aspect to provide a semiconductor package configured to lower the temperature applied to a semiconductor chip through a laser beam when bonding bumps of the semiconductor chip to pads of a wiring substrate.

It is another aspect to provide a semiconductor package capable of improving bonding reliability between bumps of a semiconductor chip and pads of a wiring substrate.

According to an aspect of one or more embodiments, there is provided a semiconductor package comprising a semiconductor chip including a semiconductor substrate having a first surface and a second surface opposite to the first surface; a chip pad located on the first surface and comprising a conductive layer; a support pad positioned on the first surface, spaced apart from the chip pad and comprising an insulating layer; a support bump connected to the support pad; a wiring substrate disposed to face the semiconductor substrate; a support bonding on trace (BOT) pad disposed on the wiring substrate and bonded to the support bump; and a dummy area disposed on the wiring substrate and spaced apart from the support BOT pad.

According to another aspect of one or more embodiments, there is provided a semiconductor package comprising a semiconductor chip including a semiconductor substrate having a first surface and a second surface opposite to the first surface; a chip pad located on the first surface and comprising a conductive layer; a support pad positioned on the first surface, spaced apart from the chip pad and comprising an insulating layer; a conductive bump connected to the chip pad; a support bump connected to the support pad; a wiring substrate disposed to face the semiconductor substrate; a wiring BOT pad disposed on the wiring substrate and bonded to the conductive bump; a support BOT pad disposed on the wiring substrate and bonded to the support bump; and a dummy area disposed on the wiring substrate, spaced apart from the support BOT pad and comprising a conductive layer; wherein the conductive bump is electrically connected to a wiring layer formed on the wiring substrate and the support bump is not electrically connected to the wiring layer.

According to yet another aspect of one or more embodiments, there is provided a semiconductor package comprising a semiconductor chip including a semiconductor substrate having a first surface and a second surface opposite to the first surface; a chip pad located on the first surface and comprising a conductive layer; a support pad positioned on the first surface, spaced apart from the chip pad and comprising an insulating layer; a conductive bump connected to the chip pad; a support bump connected to the support pad; a wiring substrate disposed to face the semiconductor substrate; a wiring BOT pad disposed on the wiring substrate and bonded to the conductive bump; a support BOT pad disposed on the wiring substrate and bonded to the support bump; and a dummy area disposed on the wiring substrate and spaced apart from the support BOT pad, wherein the support BOT pad is part of a first linear trace pattern extending in a first direction in a plane on the wiring substrate, and the dummy area is spaced apart from the first linear trace pattern and surrounds the first linear trace pattern in a plane on the wiring substrate.

BRIEF DESCRIPTION OF THE DRAWINGS

Various embodiments will be more clearly understood from the following detailed description taken in conjunction with the accompanying drawings, in which.

DETAILED DESCRIPTION

Figure 1:
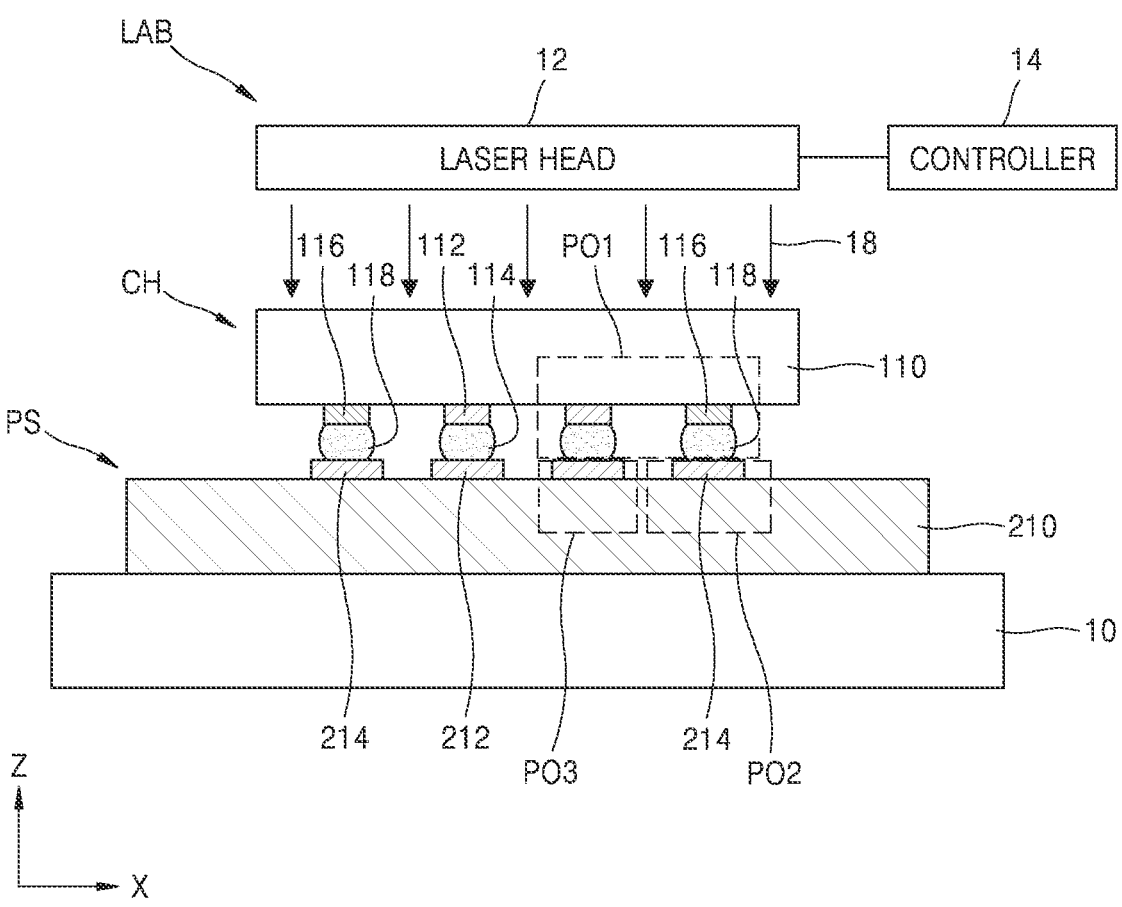
FIG. 1 is a schematic cross-sectional view for explaining a bonding process of bonding pads of a wiring substrate to bumps of a semiconductor chip according to some embodiments.

Hereinafter, various embodiments will be described with reference to the attached drawings. In the drawings, like numerals denote like elements and redundant descriptions thereof will be omitted for conciseness.

It is proposed to bond the bumps of the semiconductor chip to the pads of the wiring substrate by a laser assisted bonding device. The laser assisted bonding device may be a device that bonds the bumps of the semiconductor chip to the pads of the wiring substrate by transferring heat to the semiconductor chip through a laser beam.

As semiconductor chips are miniaturized and the density thereof increases, it is necessary to lower the temperature applied to a semiconductor chip through a laser beam when bonding bumps of the semiconductor chip to pads of a wiring substrate.

When bonding bumps of a semiconductor chip to pads of a wiring substrate, if the temperature applied to the semiconductor chip through a laser beam is high, warpage of the semiconductor chip may increase, and accordingly, the semiconductor chip may not operate as desired. In addition, as the warpage of the semiconductor chip increases, bumps of the semiconductor chip and pads of the wiring substrate in the semiconductor package may not be bonded to each other.

A semiconductor package according to some embodiments may be configured to lower the temperature applied to a semiconductor chip through a laser beam when bonding bumps of the semiconductor chip to pads of a wiring substrate, and/or to be capable of improving bonding reliability between bumps of a semiconductor chip and pads of a wiring substrate.

Figure 2:
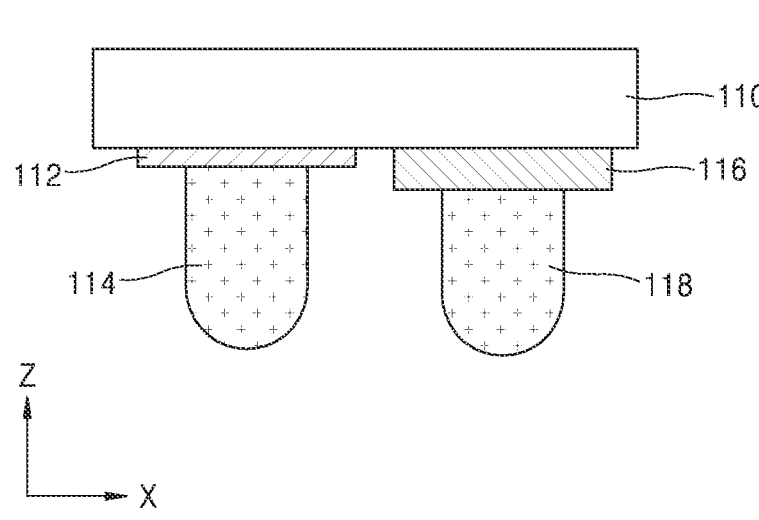
FIG. 2 is an example of an enlarged view of PO1 of FIG. 1, according to some embodiments.

FIG. 1 is a schematic cross-sectional view illustrating a bonding process of bonding pads of a wiring substrate to bumps of a semiconductor chip according to some embodiments, and FIG. 2 is an example of an enlarged view of PO1 of FIG. 1, according to some embodiments.

Specifically, as shown in FIG. 1, a wiring bonding on trace (BOT) pad 212 and a support BOT pad 214 of a wiring substrate 210 may be respectively bonded to a conductive bump 114 and support bump 118 of a semiconductor chip CH using a laser assisted bonding (LAB) device. The LAB device may include a vacuum block 10, a laser head 12, and a controller 14. The controller 14 may control the laser head 12.

The wiring substrate 210 may be mounted on the vacuum block 10. The vacuum block 10 may be a member that supports the wiring substrate 210 by sucking the wiring substrate 210 to the vacuum block 10 with vacuum pressure.

In other words, the vacuum block 10 may be a support member supporting the wiring substrate 210.

The wiring substrate 210 may be a printed circuit board (PCB). The wiring bonding on trace (BOT) pad 212 and the support BOT pad 214 may be disposed on the wiring substrate 210. The wiring BOT pad 212 and the support BOT pad 214 may each include a metal layer, for example, a copper layer.

A part of a planar arrangement of the support BOT pad 214 is denoted by PO2, and a part of a planar arrangement of the wiring BOT pad 212 is denoted by PO3. The planar arrangement of the wiring BOT pad 212 and the support BOT pad 214 is described below in detail.

The wiring BOT pad 212 may be a bump bonded to a conductive bump 114 of the semiconductor chip CH. For example, the conductive bump 114 may be a conductive solder bump. The wiring BOT pad 212 may be a bump that performs an electrical function. The support BOT pad 214 may be a bump bonded to a support bump 118 of the semiconductor chip CH. For example, the support bump 118 may be a support solder bump.

The support BOT pad 214 may be a bump that performs a mechanical function and not an electrical function. The wiring substrate 210, the wiring BOT pad 212, and the support BOT pad 214 may configure a wiring substrate structure PS.

The semiconductor chip CH may include a semiconductor substrate 110. The semiconductor chip CH may be a memory chip or a non-memory chip. The semiconductor substrate 110 may be a silicon substrate. A chip pad 112 may be disposed on a lower surface of the semiconductor substrate 110, that is, an active surface of the semiconductor substrate 110. The chip pad 112 may be a conductive pad that performs an electrical function. The chip pad 112 may include a conductive layer. For example, in some embodiments, the conductive layer may be a metal layer, such as a copper layer.

A support pad 116 may be disposed on the lower surface of the semiconductor substrate 110 apart from the chip pad 112. The support pad 116 may be a pad that does not perform an electrical function, and may be an insulating layer. In some embodiments, the insulating layer may be a photosensitive resist layer.

A conductive bump 114 may be connected to the chip pad 112. The conductive bump 114 may be a bump having an electrical function. In some embodiments, the conductive bump 114 may be a solder resist bump. The support bump 118 may be connected to the support pad 116. The support bump 118 may be a bump that performs a mechanical function and not an electrical function. In some embodiments, the support bump 118 may be a solder resist bump.

The LAB device irradiates a laser beam 18 to the semiconductor chip CH using the laser head 12. Heat is generated in the semiconductor chip CH irradiated with the laser beam 18 so that the conductive bump 114 and the support bump 118 of the semiconductor chip CH may be bonded respectively to the wiring BOT pad 212 and the support BOT pad 214 of the wiring substrate 210.

Hereinafter, a bonding process between the conductive bump 114 and the support bump 118 of the semiconductor chip CH and the wiring BOT pad 212 and the support BOT pad 214 of the wiring substrate 210 is described in more detail. A part of the semiconductor substrate 110, the chip pad 112, the conductive bump 114, the support pad 116, and the support bump 118 in FIG. 1 is denoted by PO1. FIG. 2 is an enlarged view of PO1 of FIG. 1.

Heat generated in the semiconductor chip CH, that is, the semiconductor substrate 110, by irradiation of the laser beam 18 may be transferred through the conductive bump 114 and the chip pad 112 composed of a conductive layer. Heat generated in the semiconductor chip CH, that is, the semiconductor substrate 110, by irradiation of the laser beam 18 may be transferred through the support bump 118 and the support pad 116 composed of an insulating layer.

Heat generated in the semiconductor substrate 110 may be transferred less through the support pad 116 composed of an insulating layer than through the chip pad 112 composed of a conductive layer. Accordingly, bonding reliability between the support bump 118 and the support BOT pad 214 may be lower than that between the conductive bump 114 and the wiring BOT pad 212.

Accordingly, embodiments configure the planar and cross-sectional structure of the support BOT pad 214 as a separable structure so that heat generated in the semiconductor substrate 110 may be well transferred to the support bump 118 and the support BOT pad 214 through the support pad 116 composed of an insulating layer. The planar arrangement or structure of the support BOT pad 214 is described in detail later.

In some embodiments, when the heat generated in the semiconductor substrate 110 is transferred well to the support bump 118 and the support BOT pad 214 through the support pad 116 composed of an insulating layer, the temperature of the laser beam using the controller 14 of the LAB device may be lowered by several tens of degrees Celsius. For example, the temperature of the laser beam may be lowered from about 300° C. to 260° C. When the temperature of the laser beam is lowered using the controller 14 of the LAB device, warpage of the semiconductor chip CH and the wiring substrate 210 may be reduced and the deterioration of electrical characteristics of the semiconductor chip CH may also be prevented.

Figure 3:
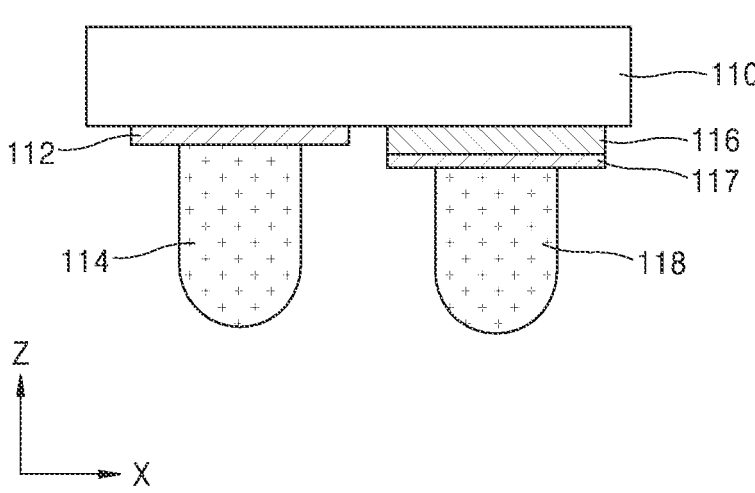
FIG. 3 is another example of an enlarged view of PO1 of FIG. 1, according to some embodiments.

FIG. 3 is another example of an enlarged view of PO1 of FIG. 1, according to some embodiments.

Specifically, the another example of an enlarged view of PO1 in FIG. 1 is denoted by PO1-1. As shown in FIG. 3, PO1-1 may include a semiconductor substrate 110, a chip pad 112, a conductive bump 114, a support pad 116, and a support bump 118.

In some embodiments, an auxiliary support pad 117 may be further positioned under the support pad 116 as illustrated in PO1-1. The auxiliary support pad 117 may be composed of a conductive layer. When the auxiliary support pad 117 is further included, the support bump 118 may be more easily formed.

Even when the auxiliary support pad 117 is formed, heat generated in the semiconductor substrate 110 may be transferred less to the support bump 118 through the auxiliary support pad 117 and the support pad 116 composed of an insulating layer than through the chip pad 112 composed of a conductive layer.

Figure 4:
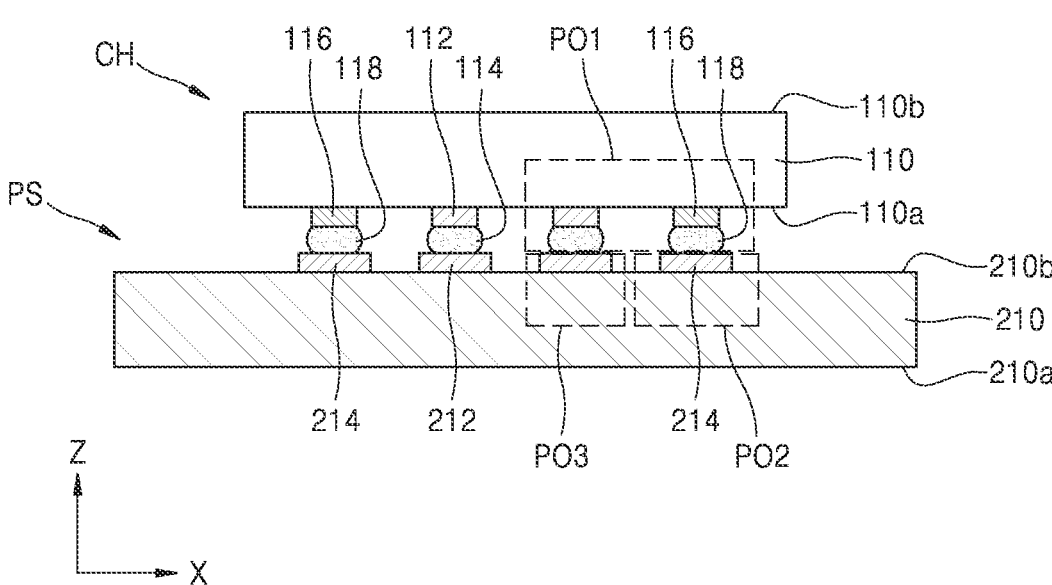
FIG. 4 is a cross-sectional view illustrating a semiconductor package according to some embodiments.

FIG. 4 is a cross-sectional view illustrating a semiconductor package according to some embodiments.

Specifically, a semiconductor package PK1 shows a structure obtained by bonding the wiring BOT pad 212 and the support BOT pad 214 of the wiring substrate 210 respectively to the conductive bump 114 and the support bump 118 of the semiconductor chip CH using the LAB device shown in FIG. 1. In FIG. 4, the descriptions given with reference to FIG. 1 are briefly given or omitted for conciseness.

The semiconductor package PK1 may include a semiconductor chip CH and a wiring substrate structure PS. The semiconductor chip CH may include a semiconductor substrate 110, a chip pad 112, a conductive bump 114, a support pad 116, and a support bump 118. In FIG. 4, a part of the semiconductor substrate 110, the chip pad 112, the conductive bump 114, the support pad 116, and the support bump 118 is denoted by PO1 as described above.

The semiconductor substrate 110 may have a first surface 110a and a second surface 110b opposite to the first surface 110a. The first surface 110a may be an active surface on which transistors are formed, and the second surface 110b may be an inactive surface on which transistors are not formed.

The chip pad 112 composed of a conductive layer may be disposed on the first surface 110a of the semiconductor substrate 110. The conductive layer may comprise a metal layer, for example a copper layer. The conductive bump 114 may be connected to the chip pad 112.

The support pad 116 composed of an insulating layer and spaced apart from the chip pad 112 may be disposed on the first surface 110a of the semiconductor substrate 110. The support pad 116 may be connected to the support bump 118. The conductive bump 114 and the support bump 118 may be solder resist bumps.

The wiring substrate structure PS may include a wiring substrate 210, a wiring BOT pad 212, and a support BOT pad 214. The wiring substrate 210 may face the semiconductor substrate 110. The wiring substrate 210 may be a PCB. The wiring substrate 210 may have a first surface 210a and a second surface 210b opposite to the first surface 210a.

The wiring BOT pad 212 may be bonded to the conductive bump 114 on the second surface 210b of the wiring substrate 210. The support BOT pad 214 may be bonded to the support bump 118 on the second surface 210b of the wiring substrate 210. The wiring BOT pad 212 and the support BOT pad 214 may include a metal layer, for example, a copper layer. As described above, a part of the planar arrangement of the support BOT pad 214 is denoted by PO2, and a part of the planar arrangement of the wiring BOT pad 212 is denoted by PO3.

In the semiconductor package PK1 configured as described above, the planar and cross-sectional arrangement of the support BOT pad 214 is configured as a separable structure so that heat generated in the semiconductor chip CH, that is, the semiconductor substrate 110, by irradiation of the laser beam (18 in FIG. 1) is well transferred to the support bump 118 and the support BOT pad 214 through the support pad 116 composed of an insulating layer. The planar arrangement or structure of the support BOT pad 214 is described below in detail.

In the semiconductor package PK1, when the support BOT pad 214 is formed in a separable structure, warpage of the semiconductor chip CH and the wiring substrate 210 may be reduced and the deterioration of electrical characteristics of the semiconductor chip CH may be prevented by lowering the temperature of a laser beam using the controller (14 in FIG. 1) of the LAB device (LAB in FIG. 1).

Figure 5:
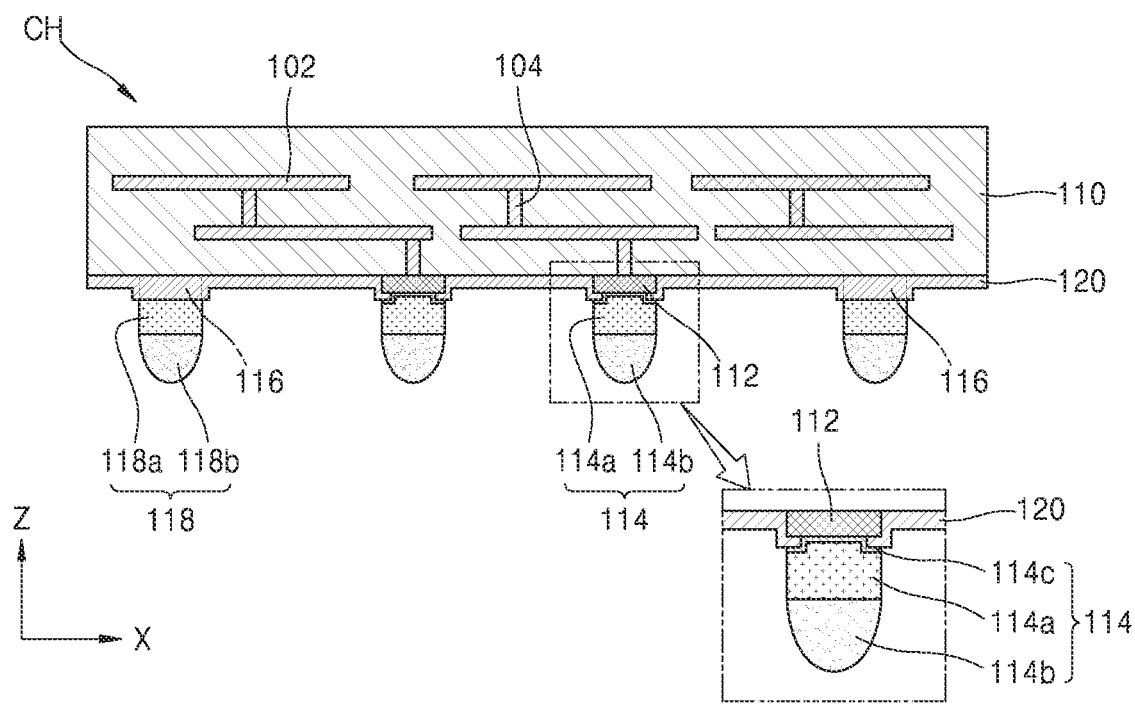
FIG. 5 is a cross-sectional view illustrating an example of a semiconductor chip of the semiconductor package of FIG. 4, according to some embodiments.

FIG. 5 is a cross-sectional view illustrating an example of a semiconductor chip of the semiconductor package PK1 of FIG. 4, according to some embodiments.

Specifically, in FIG. 5, the descriptions given with reference to FIG. 4 are briefly given or omitted for conciseness. The semiconductor chip CH may include the semiconductor substrate 110, the chip pad 112, the conductive bump 114, the support pad 116, and the support bump 118.

The semiconductor chip CH may include a chip wiring layer 102 and a chip via layer 104. The chip wiring layer 102 and the chip via layer 104 may be connected to the chip pad 112. The chip pad 112 may be a conductive pad that performs an electrical function. The conductive bump 114 may be connected to the chip pad 112.

The conductive bump 114 may include a conductive pillar 114a and a solder cap layer 114b formed under the conductive pad 112. The conductive pillar 114a may include a metal layer, for example, a copper (Cu) layer. The solder cap layer 114b may include a metal layer, for example, a double metal layer of a tin (Sn) layer and a silver (Ag) layer. In some embodiments, the conductive bump 114 may include a barrier metal layer 114c between the conductive pad 112 and the conductive pillar 114a, for example, a double metal layer of a titanium layer and a copper layer.

The support pad 116 and the support bump 118 may be under the semiconductor substrate 110. The support pad 116 may be a part of a support pad insulating layer 120. The support pad 116 may be connected to the support pad insulating layer 120. The support pad insulating layer 120 may be formed of the same material as the support pad 116. The support pad 116 and the support pad insulating layer 120 may be formed on a same level. In some embodiments, the supporting pad insulating layer 120 may be a photo sensitive resist layer.

The support bump 118 may have the same structure as the conductive bump 114. The support bump 118 may include a support conductive pillar 118a and a support solder cap layer 118b formed under the support pad 116. The supporting conductive pillar 118a may be formed of the same material as the conductive pillar 114a. The support solder cap layer 118b may be formed of the same material as the solder cap layer 114b. In some embodiments, the support bump 118 may include a support barrier metal layer (not shown) under the support pad 116, like the conductive bump 114. The support pad 116 and the support bump 118 may not perform an electrical function because the support pad 116 and the support bump 118 are not connected to the chip wiring layer 102 and the chip via layer 104.

Figure 6:
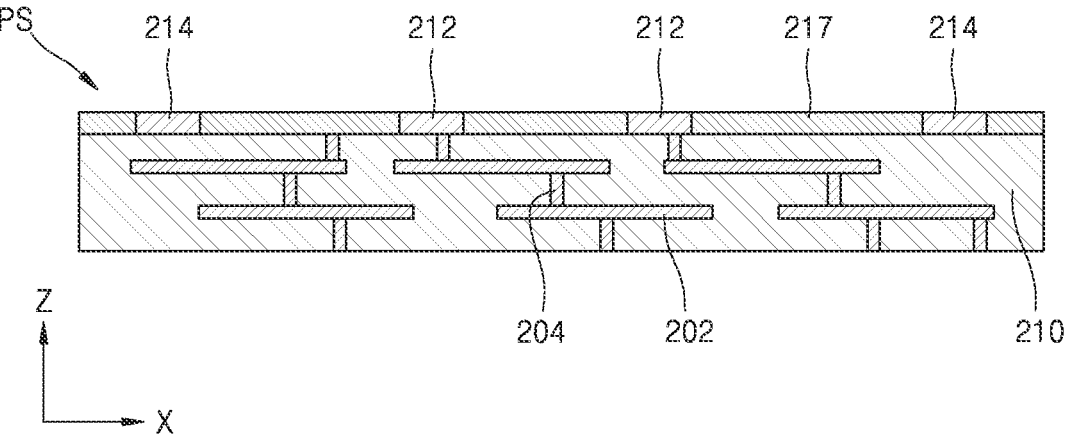
FIG. 6 is a cross-sectional view illustrating an example of a wiring substrate structure of the semiconductor package of FIG. 4, according to some embodiments.

FIG. 6 is a cross-sectional view illustrating an example of a wiring substrate structure constituting the semiconductor package PK1 of FIG. 4, according to some embodiments.

Specifically, in FIG. 6, the descriptions given with reference to FIG. 4 are briefly given or omitted for conciseness. The wiring substrate structure PS may include the wiring substrate 210, the wiring BOT pad 212, and the support BOT pad 214.

The wiring substrate 210 may be a PCB. The wiring substrate 210 may include a wiring layer 202 and a via layer 204. The wiring layer 202 and the via layer 204 may include a metal layer, such as a copper layer. The wiring BOT pad 212 may be connected to the wiring layer 202 and the via layer 204 to perform an electrical function.

The wiring BOT pad 212 may contact the conductive bump 114 of FIG. 5. The support BOT pad 214 may contact the support bump 118 of FIG. 5. The support BOT pad 214 may not perform an electrical function because the support BOT pad 214 is not connected to the chip pad 112 described above. The wiring BOT pad 212 may be insulated from the support BOT pad 214 by a wiring insulating layer 217.

Figure 7:
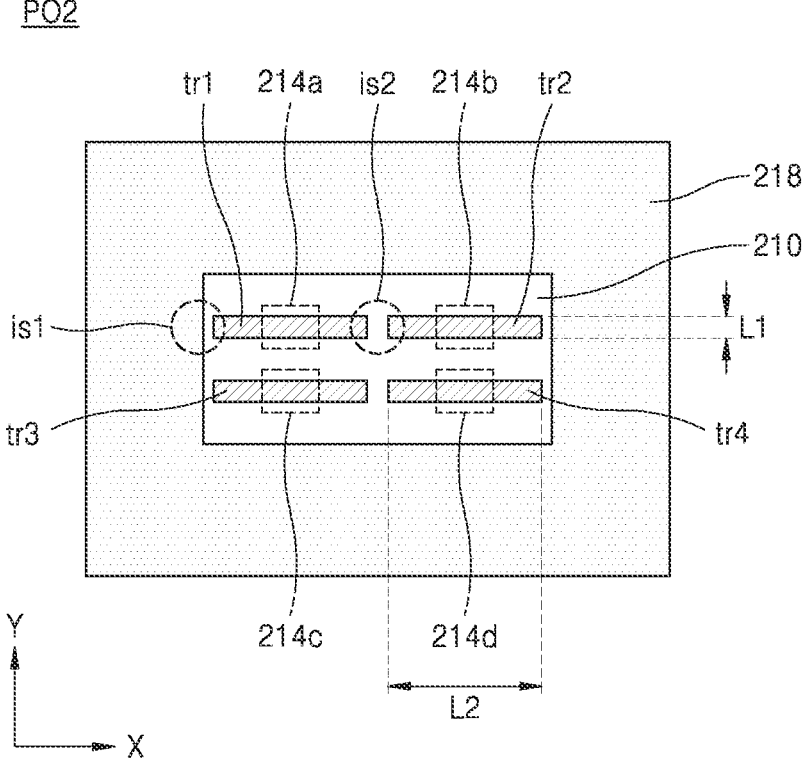
FIG. 7 is a plan view illustrating a part of a support bonding on trace (BOT) pad of a wiring substrate structure of the semiconductor package of FIG. 4 according to some embodiments.

FIG. 7 is a plan view illustrating a part of a support BOT pad of a wiring substrate structure of the semiconductor package PK1 of FIG. 4 according to some embodiments.

Specifically, in FIG. 7, the descriptions given with reference to FIG. 4 are briefly given or omitted for conciseness. FIG. 7 shows PO2 which is a part of the planar arrangement of the support BOT pad 214.

The support BOT pad 214 may be one of a first support BOT pad 214a, a second support BOT pad 214b, a third support BOT pad 214c, 214c and a fourth support BOT pad 214d. The first to fourth support BOT pads 214a, 214b, 214c, 214c and 214d may be disposed on the wiring substrate 210.

The first to fourth support BOT pads 214a, 214b, 214c and 214d may be a part of a first linear trace pattern tr1, a second linear trace pattern tr2, a third linear trace pattern tr3, and a fourth linear trace pattern tr4, respectively, extending in a first direction (X direction) on the wiring substrate 210. A dummy area 218 may be disposed around the first to fourth support BOT pads 214a, 214b, 214c and 214d. In some embodiments the dummy area 218 may be a conductive area, such as a metal area. In some embodiments, the dummy area 218 may be a copper area. In some embodiments, the dummy area 218 may be a heat block area.

The first to fourth support BOT pads 214a, 214b, 214c, and 214d may be separated from the dummy area 218 by a first separation area is1. Accordingly, heat is not transferred to the dummy area 218 from the first to fourth support BOT pads 214a, 214b, 214c, and 214d.

The first linear trace pattern tr1 may be spaced apart from the second linear trace pattern tr2 in the first direction by a second separation area is2. The third linear trace pattern tr3 may be spaced apart from the fourth linear trace pattern tr4 in the first direction, like the first linear trace pattern tr1 and the second linear trace pattern tr2.

The first to fourth linear trace patterns tr1, tr2, tr3, and tr4 may have a first length L1 in a second direction (Y direction) and a second length L2 in a first direction (X direction), wherein the second length L2 is greater than the first length L1. In some embodiments, the first length L1 may be several micrometers, and the second length L2 may be several tens to hundreds of micrometers.

As described above, in the semiconductor package PK1, heat may not be transferred to the dummy area 218 from the first to fourth support BOT pads 214a, 214b, 214c, and 214d because the first to fourth support BOT pads 214a, 214b, 214c, and 214d are not connected to the dummy area 218. Accordingly, the first to fourth support BOT pads 214a, 214b, 214c, and 214d may be easily bonded to the support bump 118 at a low temperature.

Figure 8:
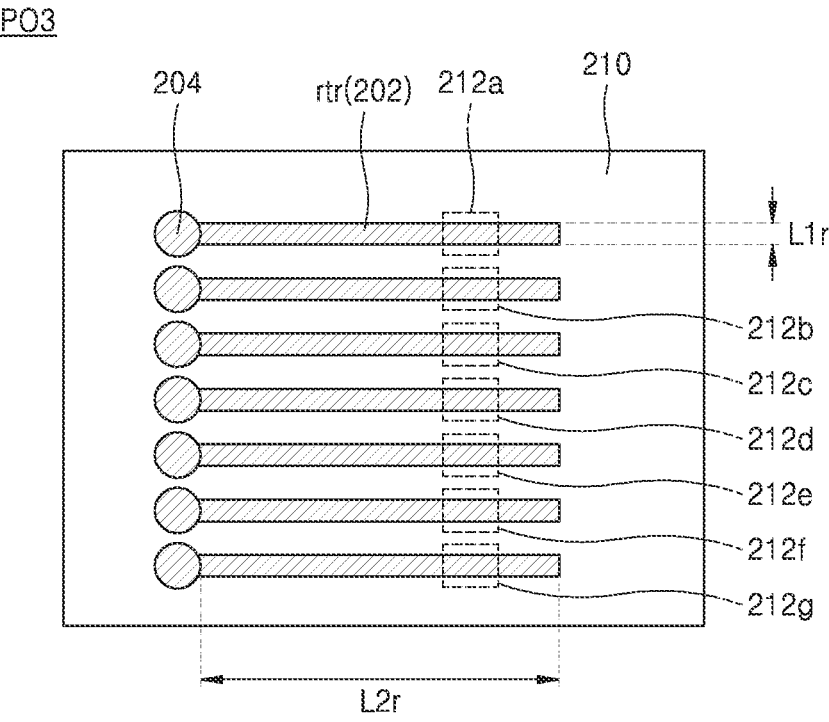
FIG. 8 is a plan view illustrating a part of a wiring BOT pad of a wiring substrate structure of the semiconductor package of FIG. 4 according to some embodiments.

FIG. 8 is a plan view illustrating a part of a wiring BOT pad of a wiring substrate structure of the semiconductor package PK1 of FIG. 4 according to some embodiments.

Specifically, in FIG. 8, descriptions given with reference to FIG. 4 are briefly given or omitted for conciseness. FIG. 8 illustrates PO3 which is a part of the planar arrangement of the wiring BOT pad 212.

The wiring BOT pad 212 may be one of a first wiring BOT pad 212a, a second wiring BOT pad 212b, a third wiring BOT pad 212c, a fourth wiring BOT pad 212d, a fifth wiring BOT pad 212e, a sixth wiring BOT pad 212f, and a seventh wiring BOT pad. The first to seventh wiring BOT pads 212a, 212b, 212c, 212d, 212e, 212f, and 212g may be disposed on the wiring substrate 210.

The first to seventh wiring BOT pads 212a, 212b, 212c, 212d, 212e, 212f, and 212g may be a part of real linear trace patterns rtr, respectively, extending in the first direction (X direction) on the wiring substrate 210. The real linear trace patterns rtr may be part of the wiring layer 202 formed on the wiring substrate 210. A via layer 204 may be formed at one end of the real linear trace patterns rtr.

The real linear trace patterns rtr may extend in a first direction and may be spaced apart from each other in a second direction. The real linear trace patterns rtr may have a first length L1r in a second direction (Y direction) and a second length L2r in a first direction (X direction), wherein the second length L2r is greater than the first length L1r. In some embodiments, the first length L1$r$ may be several micrometers, and the second length L2$r$ may be several tens to hundreds of micrometers.

As described above, in the semiconductor package PK1, heat may not be transferred to the outside of the first to seventh wiring BOT pads 212$a$, 212$b$, 212$c$, 212$d$, 212$e$, 212$f$, and 212$g$. Accordingly, the first to seventh wiring BOT pads 212$a$, 212$b$, 212$c$, 212$d$, 212$e$, 212$f$, and 212$g$ may be easily bonded to the conductive bump 114 at a low temperature.

Figure 9:
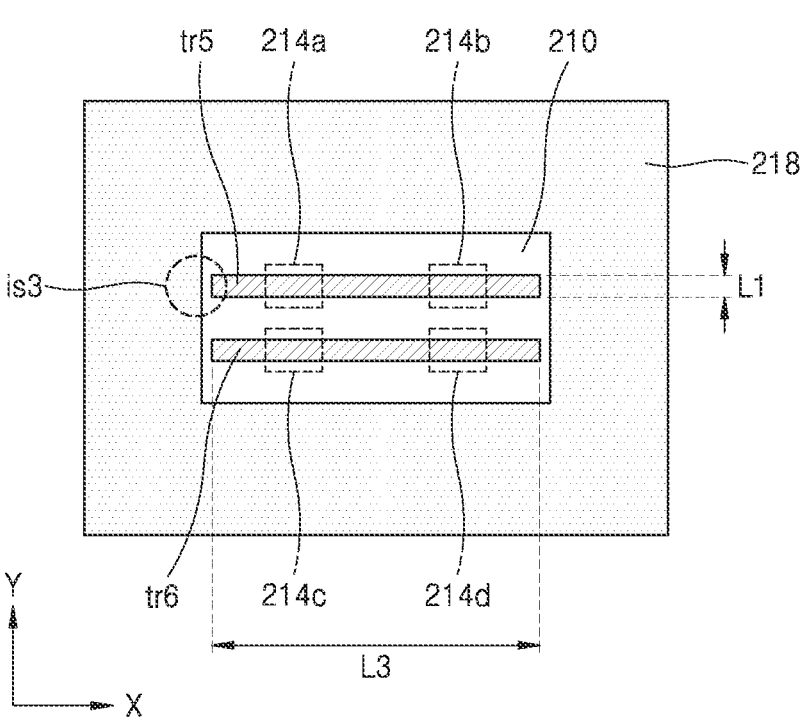
FIG. 9 is a plan view illustrating a part of a support BOT pad of a wiring substrate structure of the semiconductor package of FIG. 4 according to some embodiments.

FIG. 9 is a plan view illustrating a part of the support BOT pad of the wiring substrate structure of the semiconductor package PK1 of FIG. 4 according to some embodiments.

Specifically, in FIG. 9, the descriptions given with reference to FIG. 4 are briefly given or omitted for conciseness. FIG. 9 shows PO2 which is a part of the planar arrangement of the support BOT pad 214. In FIG. 9, a part of the planar arrangement of the support BOT pad 214 is denoted by PO2-1.

The support BOT pad 214 may be one of a first support BOT pad 214$a$, a second support BOT pad 214$b$, a third support BOT pad 214$c$ and a fourth support BOT pad 214$d$. The first to fourth support BOT pads 214$a$, 214$b$, 214$c$ and 214$d$ may be disposed on the wiring substrate 210.

The first to fourth support BOT pads 214$a$, 214$b$, 214$c$ and 214$d$ each may be a part of a fifth linear trace pattern tr5 and a sixth linear trace pattern tr6 extending in the first direction (X direction) on the wiring substrate 210. The dummy area 218 may be disposed around the fifth and sixth linear trace patterns tr5 and tr6. In some embodiments, the dummy area 218 may be a conductive area, such as a metal area. In some embodiments, the dummy area 218 may be a copper area. In some embodiments, the dummy area 218 may be a heat block area.

The first to fourth support BOT pads 214$a$, 214$b$, 214$c$ and 214$d$ may be separated from the dummy area 218 by a third separation area is3. Accordingly, heat is not transferred to the dummy area 218 from the first to fourth support BOT pads 214$a$, 214$b$, 214$c$ and 214$d$.

The fifth linear trace pattern tr5 may be spaced apart from the sixth linear trace pattern tr6 in the second direction. The fifth and sixth linear trace patterns tr5 and tr6 may have a first length L1 in a second direction (Y direction) and a third length L3 in a first direction (X direction). In some embodiments, the first length L1 may be several micrometers, and the third length L3 may be several tens to hundreds of micrometers.

As described above, in the semiconductor package PK1, heat may not be transferred from the first to fourth support BOT pads 214$a$, 214$b$, 214$c$ and 214$d$ to the dummy area 218 because the first to fourth support BOT pads 214$a$, 214$b$, 214$c$ and 214$d$ are not connected to the dummy area 218. Accordingly, the first to fourth support BOT pads 214$a$, 214$b$, 214$c$ and 214$d$ may be easily bonded to the support bump 118 at a low temperature.

Figure 10:
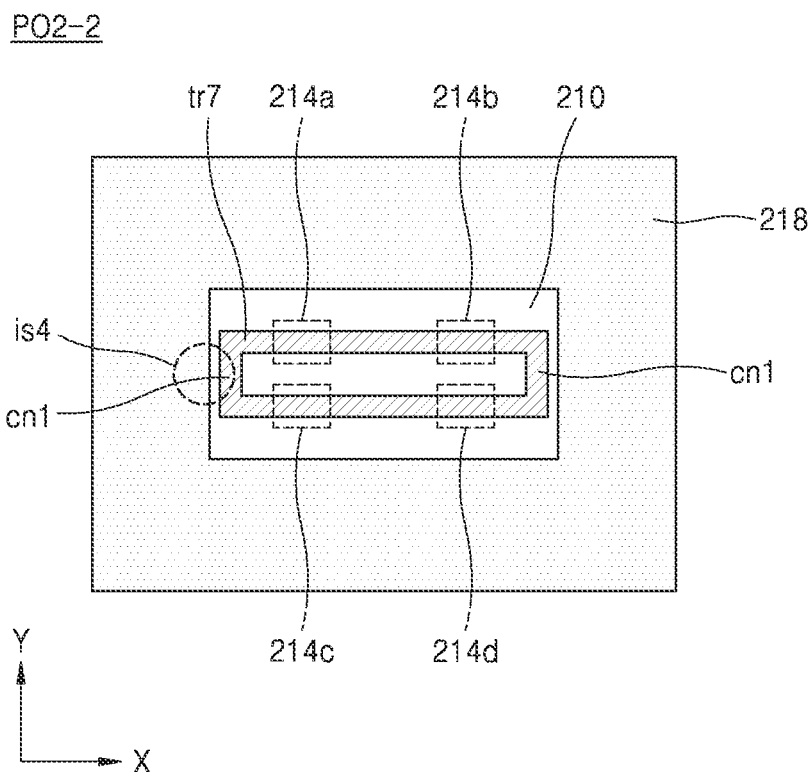
FIG. 10 is a plan view illustrating a part of a support BOT pad of a wiring substrate structure of the semiconductor package of FIG. 4 according to some embodiments.

FIG. 10 is a plan view illustrating a part of a support BOT pad of a wiring substrate structure constituting the semiconductor package PK1 of FIG. 4 according to some embodiments.

Specifically, in FIG. 10, the descriptions given with reference to FIGS. 4 and 9 are briefly given or omitted for conciseness. FIG. 10 shows PO2 which is a part of the planar arrangement of the BOT support pad 214. In FIG. 10, a part of the planar arrangement of the support BOT pad 214 is denoted by PO2-2.

The support BOT pad 214 may be one of a first support BOT pad 214$a$, a second support BOT pad 214$b$, a third support BOT pad 214$c$ and a fourth support BOT pad 214$d$. The first to fourth support BOT pads 214$a$, 214$b$, 214$c$ and 214$d$ may be disposed on the wiring substrate 210.

The first to fourth support BOT pads 214$a$, 214$b$, 214$c$ and 214$d$ may be part of a first circular trace pattern tr7 constituting a closed loop in a plane on the wiring substrate. The first circular trace pattern tr7 on the wiring substrate 210 may comprise fifth and sixth linear trace patterns tr5 and tr6 (see FIG. 9) extending in the first direction (X direction) and spaced apart from each other in the second direction and connection patterns cn1 connecting the fifth and sixth linear trace patterns try and tr6 in the second direction.

The dummy area 218 may be disposed around the first circular trace pattern tr7. In some embodiments, the dummy area 218 may be a conductive area, such as a metal area. In some embodiments, the dummy area 218 may be a copper area. In some embodiments, the dummy area 218 may be a heat block area.

The first to fourth support BOT pads 214$a$, 214$b$, 214$c$ and 214$d$ may be separated from the dummy area 218 by a fourth separation area is4. Accordingly, heat is not transferred from the first to fourth support BOT pads 214$a$, 214$b$, 214$c$ and 214$d$ to the dummy area 218.

As described above, in the semiconductor package PK1, heat may not be transferred from the first to fourth support BOT pads 214$a$, 214$b$, 214$c$ and 214$d$ to the dummy area 218 because the first to fourth support BOT pads 214$a$, 214$b$, 214$c$ and 214$d$ are not connected to the dummy area 218. Accordingly, the first to fourth support BOT pads 214$a$, 214$b$, 214$c$ and 214$d$ may be easily bonded to the support bump 118 at a low temperature.

Figure 11:
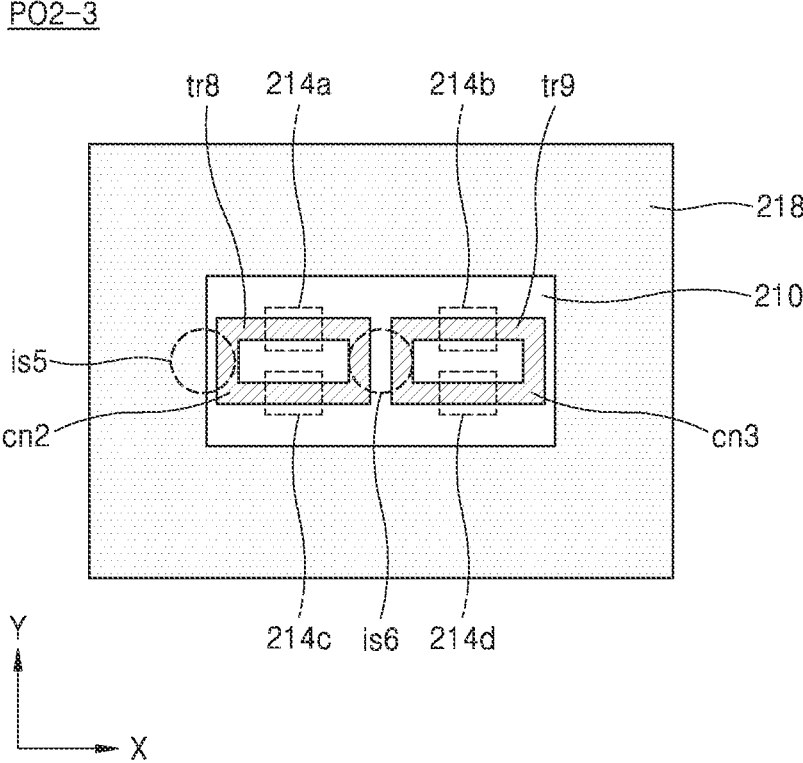
FIG. 11 is a plan view illustrating a part of a support BOT pad of a wiring substrate structure of the semiconductor package of FIG. 4 according to some embodiments.

FIG. 11 is a plan view illustrating a part of a support BOT pad of a wiring substrate structure constituting the semiconductor package PK1 of FIG. 4 according to some embodiments.

Specifically, in FIG. 11, the descriptions given with reference to FIGS. 4, 7, and 10 are briefly given or omitted for conciseness. FIG. 11 shows PO2 which is a part of the planar arrangement of the support BOT pad 214. In FIG. 11, a part of the planar arrangement of the support BOT pad 214 is denoted by PO2-3.

The support BOT pad 214 may be one of a first support BOT pad 214$a$, a second support BOT pad 214$b$, a third support BOT pad 214$c$ and a fourth support BOT pad 214$d$. The first to fourth support BOT pads 214$a$, 214$b$, 214$c$ and 214$d$ may be disposed on the wiring substrate 210.

The first to fourth support BOT pads 214$a$, 214$b$, 214$c$ and 214$d$ may be part of a second circular trace pattern tr8 and a third circular trace pattern tr9 constituting a closed loop in a plane on the wiring substrate.

The second circular trace pattern tr8 on the wiring substrate 210 may comprise first and third linear trace patterns tr1 and tr3 (see FIG. 7) extending in the first direction (X direction) and spaced apart from each other in the second direction and connection patterns cn2 connecting the first and third linear trace patterns tr1 and tr3 in the second direction.

The third circular trace pattern tr9 on the wiring substrate 210 may comprise second and fourth linear trace patterns tr2 and tr4 (see FIG. 7) extending in the first direction (X direction) and spaced apart from each other in the second direction and connection patterns cn3 connecting the second and fourth linear trace patterns tr2 and tr4 in the second direction.

The dummy area 218 may be disposed around the second and third circular trace patterns tr8 and tr9. In some embodiments, the dummy area 218 may be a conductive area, such as a metal area. In some embodiments, the dummy area 218 may be a copper area. In some embodiments, the dummy area 218 may be a heat block area.

The first to fourth support BOT pads 214a, 214b, 214c and 214d may be separated from the dummy area 218 by the fifth separation area is4. Accordingly, heat is not transferred to the dummy area 218 from the first to fourth support BOT pads 214a, 214b, 214c and 214d.

As described above, in the semiconductor package PK1, heat may not be transferred to the dummy area 218 from the first to fourth support BOT pads 214a, 214b, 214c and 214d because the first to fourth BOT support pads 214a, 214b, 214c and 214d are not connected to the dummy area 218. Accordingly, the first to fourth support BOT pads 214a, 214b, 214c and 214d may be easily bonded to the support bump 118 at a low temperature.

Figure 12:
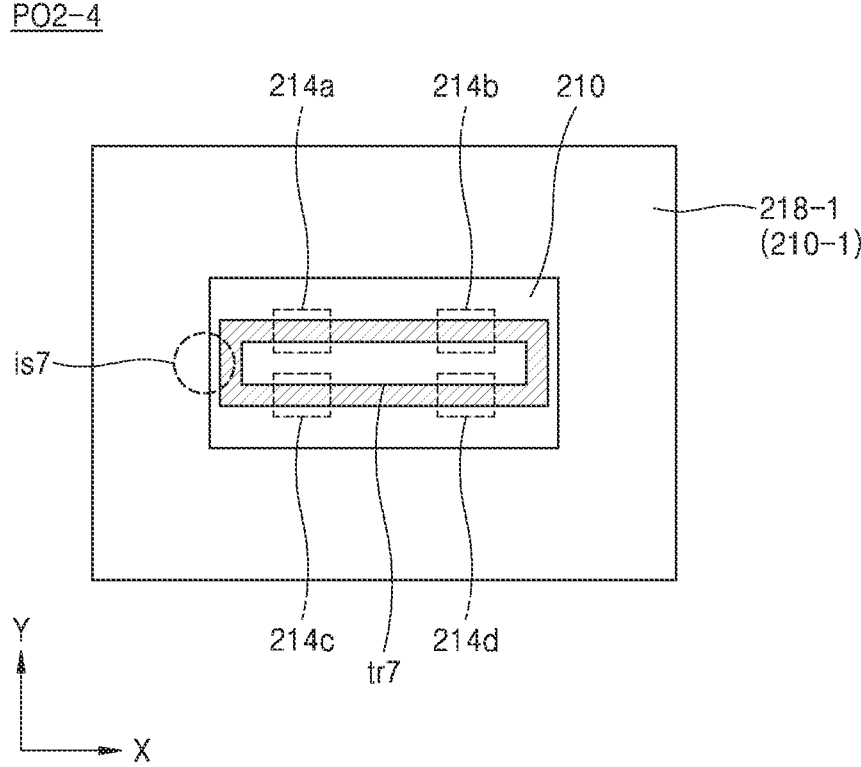
FIG. 12 is a plan view illustrating a part of a support BOT pad of a wiring substrate structure of the semiconductor package of FIG. 4 according to some embodiments.

FIG. 12 is a plan view illustrating a part of a support BOT pad of a wiring substrate structure constituting the semiconductor package PK1 of FIG. 4 according to some embodiments.

Specifically, in FIG. 12, the descriptions given with reference to FIGS. 4 and 10 are briefly given or omitted for conciseness. FIG. 12 shows PO2 which is a part of the planar arrangement of the support BOT pad 214. In FIG. 12, a part of the planar arrangement of the support BOT pad 214 is denoted by PO2-4.

The support BOT pad 214 may be one of a first support BOT pad 214a, a second support BOT pad 214b, a third support BOT pad 214c and a fourth support BOT pad 214d. The first to fourth support BOT pads 214a, 214b, 214c and 214d may be disposed on the wiring substrate 210.

The first to fourth support BOT pads 214a, 214b, 214c and 214d may be part of a first circular trace pattern tr7 constituting a closed loop in a plane on a wiring substrate 210. The first circular trace pattern tr7 on the wiring substrate 210 may comprise fifth and sixth linear trace patterns tr5 and tr6 (see FIG. 9) extending in the first direction (X direction) and spaced apart from each other in the second direction and connection patterns cn1 connecting the fifth and sixth linear trace patterns tr5 and tr6 in the second direction.

A dummy area 218-1 may be disposed around the first circular trace pattern tr7. The dummy area 218-1 may be an area of the wiring substrate 210-1, for example, an insulating layer. In some embodiments, the dummy area 218-1 may be a photo sensitive resist layer. In some embodiments, the dummy area 218-1 may be a heat block area.

The first to fourth support BOT pads 214a, 214b, 214c and 214d may be separated from the dummy area 218-1 by the seventh separation area is7. Accordingly, heat is not transferred to the dummy area 218-1 from the first to fourth support BOT pads 214a, 214b, 214c and 214d.

As described above, in the semiconductor package PK1, heat may not be transferred to the dummy area 218-1 from the first to fourth support BOT pads 214a, 214b, 214c and 214d because the first to fourth support BOT pads 214a, 214b, 214c and 214d are not connected to the dummy area 218-1. Accordingly, the first to fourth support BOT pads 214a, 214b, 214c and 214d may be easily bonded to the support bump 118 at a low temperature.

Figure 13:
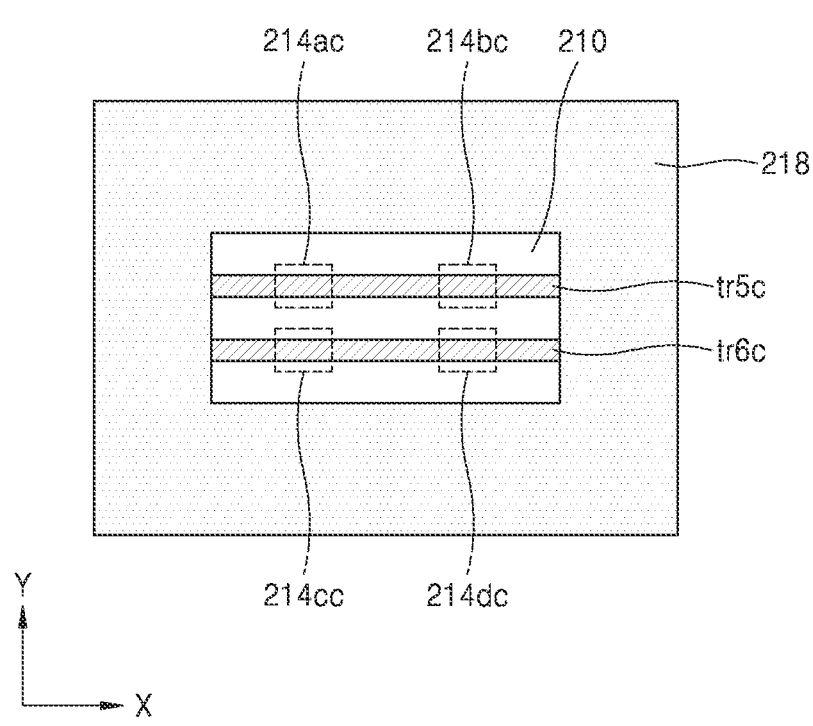
FIG. 13 is a plan view illustrating a comparative support BOT pad of a comparative example for comparison with FIG. 9.

FIG. 13 is a plan view illustrating a comparative support BOT pad in a comparative example for comparison with FIG. 9.

Specifically, FIG. 13 shows PO2c which is a part of the planar arrangement of the comparative support BOT pads 214ac, 214bc, 214cc, and 214dc for comparison with FIG. 9. The comparative support BOT pads 214ac, 214bc, 214cc, and 214dc may comprise any one of a first comparative support BOT pad 214ac, a second comparative support BOT pad 214bc, a third comparative support BOT pad 214cc and a fourth comparative support BOT pad 214dd. The first to fourth comparative support BOT pads 214ac, 214bc, 214cc, and 214dc may be disposed on the wiring substrate 210.

The first to fourth comparative support BOT pads 214ac, 214bc, 214cc, and 214dc each may be part of fifth and sixth comparative linear trace patterns tr5c and tr6c extending in the first direction (X direction) on the wiring substrate 210. The dummy area 218 may be disposed around the fifth and sixth comparative linear trace patterns tr5c and tr6c. The dummy area 218 may be a conductive area, such as a metal area. The dummy area 218 may be a copper area. The dummy area 218 may be a heat block area.

The first to fourth comparative support BOT pads 214ac, 214bc, 214cc, and 214dc may be connected to the dummy area 218. Accordingly, heat is transferred to the dummy area 218 from the first to fourth comparative support BOT pads 214ac, 214bc, 214cc, and 214dc.

When the first to fourth comparative support BOT pads 214ac, 214bc, 214cc, and 214dc are used, heat may be transferred from the first to fourth support BOT pads 214ac, 214bc, 214cc, and 214dc to the dummy area 218. Accordingly, the first to fourth comparative support BOT pads 214ac, 214bc, 214cc, and 214dc may not be easily bonded to the support bump 118 at a low temperature.

Figure 14:
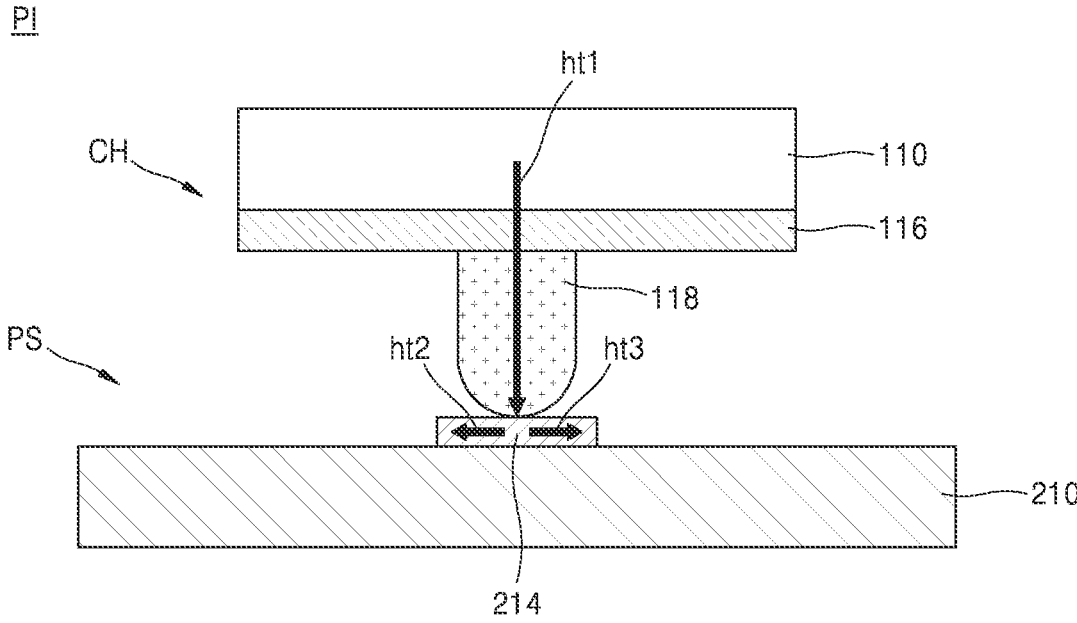
FIG. 14 is a cross-sectional view schematically illustrating heat transfer between the wiring substrate structure and the semiconductor chip of the semiconductor package according to some embodiments.
Figure 14:
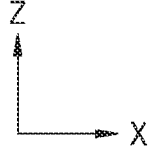

FIG. 14 is a cross-sectional view schematically illustrating heat transfer between the semiconductor chip and the wiring substrate structure of the semiconductor package according to some embodiments.

Specifically, FIG. 14 is provided to explain heat transfer between the semiconductor chip CH and the wiring substrate structure PS of the semiconductor package PK1 according to an embodiment PI. In FIG. 14, the descriptions given with reference to FIG. 4 are briefly given or omitted for conciseness.

The semiconductor chip CH may include a semiconductor substrate 110, a support pad 116, and a support bump 118. The wiring substrate structure PS may include the wiring substrate 210 and a support BOT pad 214.

The laser beam 18 (see FIG. 1) irradiated using the LAB device LAB (see FIG. 1) generates first heat ht1 in the semiconductor chip CH, that is, the semiconductor substrate 110. The first heat ht1 may be transferred to the support BOT pad 214 through the support pad 116 and the support bump 118. Second heat ht2 and ht3 transferred to the support BOT pad 214 may be transferred left and right inside the support BOT pad 214. Accordingly, the support BOT pad 214 and the support bump 118 may be bonded at a low temperature because the second heat ht2 is not transferred to the outside from the support BOT pad 214 disposed on the wiring substrate 210.

Figure 15:
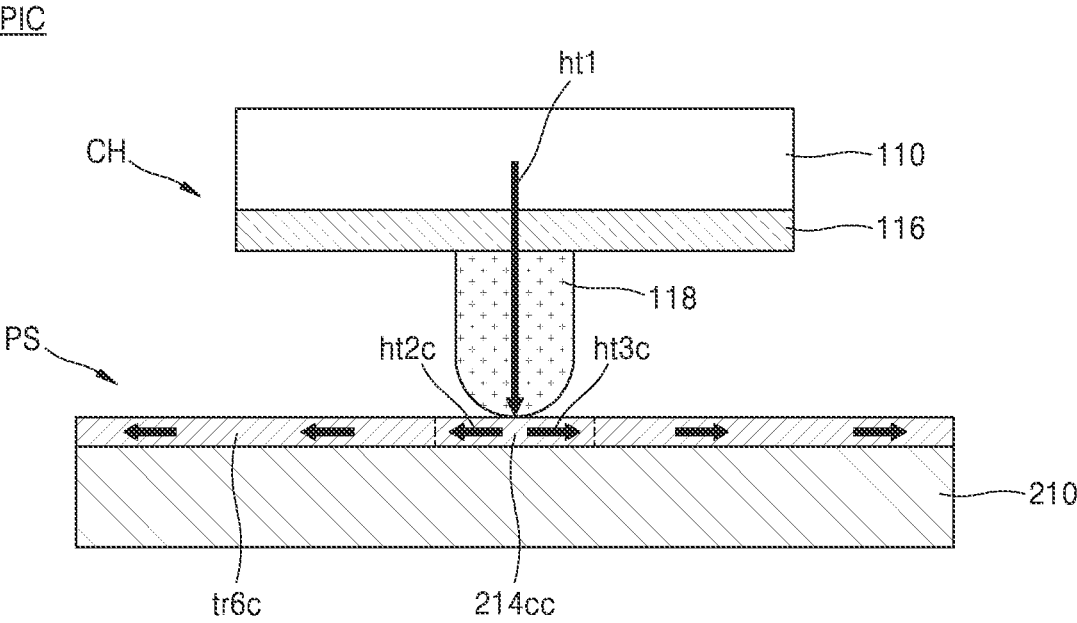
FIG. 15 is a cross-sectional view schematically illustrating heat transfer between the wiring substrate structure and the semiconductor chip of a comparative example for comparison with FIG. 14.
Figure 15:
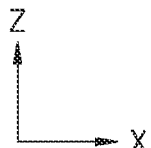

FIG. 15 is a cross-sectional view schematically illustrating heat transfer between the semiconductor chip and the wiring substrate structure of a comparative example for comparison with FIG. 14.

Specifically, FIG. 15 is provided to explain heat transfer between the semiconductor chip CH and the wiring substrate structure PS of the semiconductor package according to a comparative example PIC. In FIG. 15, the descriptions given with reference to FIG. 14 are briefly given or omitted for conciseness.

The semiconductor chip CH may include a semiconductor substrate 110, a support pad 116, and a support bump 118. The wiring substrate structure PS may include a wiring substrate 210 and a support BOT pad 214cc.

The laser beam irradiated using the LAB device generates first heat ht1 on the semiconductor chip CH, that is, the semiconductor substrate 110. The first heat ht1 may be transferred to the comparative support BOT pad 214cc through the support pad 116 and the support bump 118. Second heat ht2c and ht3c transferred to the comparative support BOT pad 214cc may be transferred from the comparative BOT pad 214cc (see FIG. 13) to the sixth comparative linear trace pattern tr6c (see FIG. 13).

Accordingly, it may be difficult to bond the comparative support BOT pad 214cc to the support bump 118 at a low temperature because the second heat ht2c is transferred to the outside from the comparative support BOT pad (214cc in FIG. 13) on the wiring substrate 210. Thus, a higher heat is required in order to perform bonding than in various embodiments discussed above.

Figure 16:
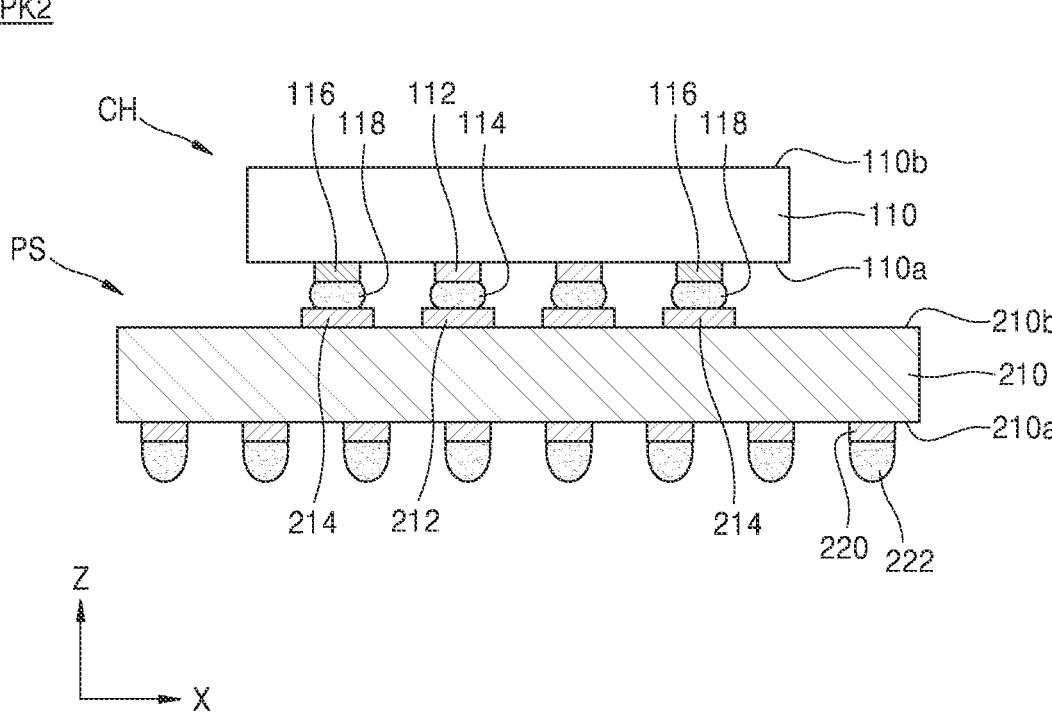
FIG. 16 is a cross-sectional view illustrating the semiconductor package according to some embodiments.

FIG. 16 is a cross-sectional view illustrating a semiconductor package according to some embodiments.

Specifically, the semiconductor package PK2 may be the same as the semiconductor package PK1 of FIG. 4 except that external connection pads 220 and external connection bumps 222 are further disposed below the wiring substrate 210. In FIG. 16, the same descriptions as given with reference to FIG. 4 are briefly given or omitted for conciseness.

The semiconductor package PK2 may include a semiconductor chip CH and a wiring substrate structure PS. The semiconductor chip CH may include a semiconductor substrate 110, a chip pad 112, a conductive bump 114, a support pad 116, and a support bump 118. The semiconductor substrate 110 may have a first surface 110a and a second surface 110b opposite to the first surface 110a.

The wiring substrate structure PS may comprise a wiring substrate 210, a wiring BOT pad 212, and a support BOT pad 214. The wiring substrate 210 may face the semiconductor substrate 110. The wiring substrate 210 may have a first surface 210a and a second surface 210b opposite to the first surface 210a. External connection pads 220 and external connection bumps 222 may be disposed on the second surface 210b of the wiring substrate 210.

The external connection pads 220 may be conductive pads. The external connection bumps 222 may be conductive bumps. As such, the semiconductor package PK2 may further include external connection pads 220 and external connection bumps 222 to be mounted on a motherboard or a mother wiring substrate.

Figure 17:
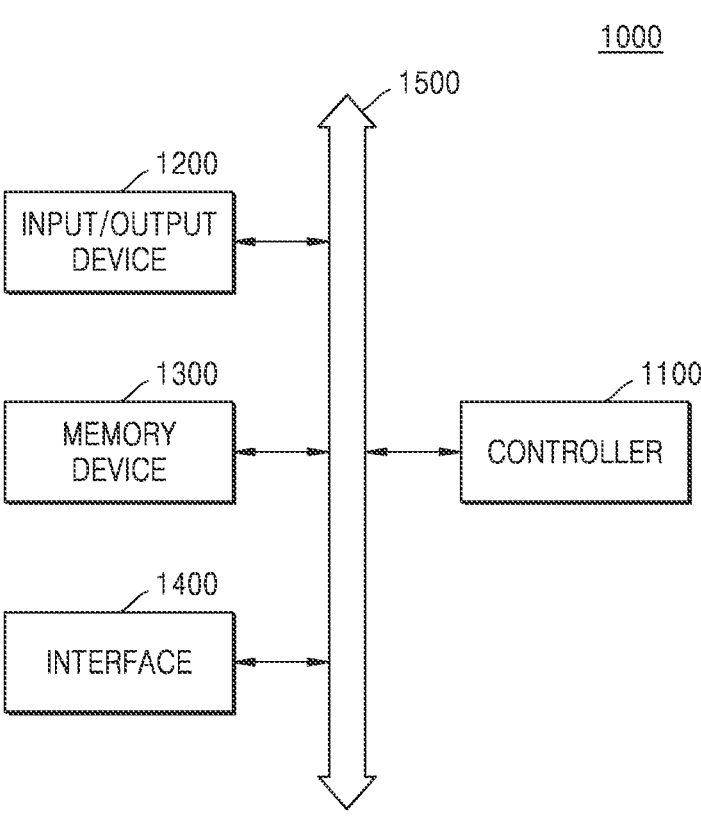
FIG. 17 is a schematic block diagram illustrating an example of a memory system having the semiconductor package according to some embodiments.

FIG. 17 is a schematic block diagram illustrating an example of a memory system having a semiconductor package according to some embodiments.

Specifically, a memory system 1000 may be applied to a personal digital assistant (PDA), a portable computer, a web tablet, a wireless phone, a mobile phone, a digital music player, a memory card, or any device capable of transmitting and/or receiving information in a wireless environment.

The memory system 1000 includes an input/output (I/O) device 1200 such as a controller 1100, a keypad, a keyboard, and a display; a memory device or a memory chip 1300; an interface 1400; and a bus 1500. The memory device 1300 and the interface 1400 communicate with each other through the bus 115.

The controller 1100 includes at least one of a microprocessor, a digital signal processor, a microcontroller, or another similar processing devices. The memory device 1300 may be used to store commands executed by the controller 1100. The input/output device 1200 may receive data or signals from the outside of the memory system 1000 or output data or signals to the outside of the memory system 1000. For example, the input/output device 1200 may include a keyboard, a keypad, or a display device.

The memory device 1300 and the controller 1100 may include semiconductor packages PK1 and PK2 according to an embodiment of the present invention. The memory device 1300 may further include other types of memories, volatile memories that are accessed any time, and other various types of memories. The interface 1400 transmits data to a communication network or to receive data from the communication network.

Figure 18:
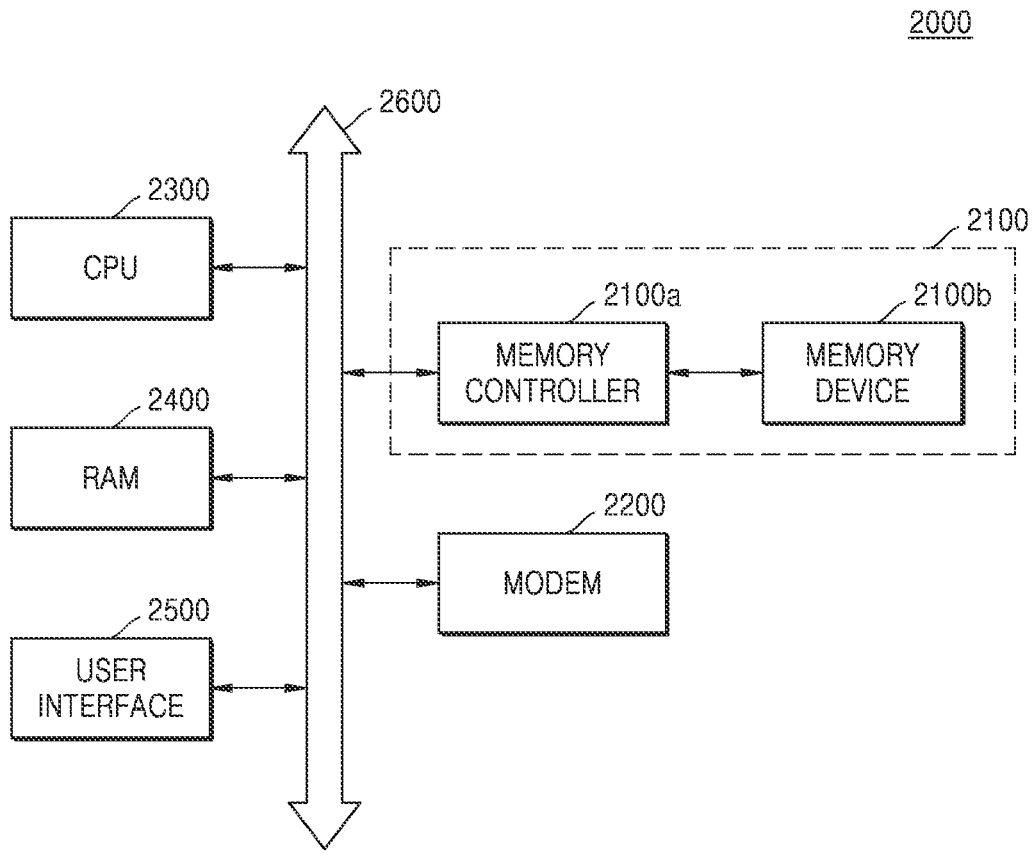
FIG. 18 is a schematic block diagram illustrating an example of an information processing system having a semiconductor package according to some embodiments.

FIG. 18 is a schematic block diagram illustrating an example of an information processing system having a semiconductor package according to some embodiments.

Specifically, an information processing system 2000 may be used in a mobile device or a desktop computer. The information processing system 2000 may include a memory system 2100 including a memory controller 2100a and a memory device 2100b.

The information processing system 2000 includes a MOdulator and DEModulator (MODEM) 2200 electrically connected to a system bus 2600, a central processing unit 2300, random-access memory (RAM) 2400, and a user interface 2500. Data processed by the central processing unit 2300 or data input from the outside is stored in the memory system 2100.

The memory system 2100 including the memory controller 2100a and the memory device 2100b, the modem 2200, the central processing unit 2300, and the RAM 2400 may include semiconductor packages PK1 and PK2 according to an embodiment of the present invention.

The memory system 2100 may be composed of a solid state drive, and in this case, the information processing system 2000 may stably store large amounts of data in the memory system 2100. In addition, as reliability increases, the memory system 2100 may save resources required for error correction and thus provide a high-speed data exchange function to the information processing system 2000.

Although not shown, the information processing system 2000 may further include an application chipset, a camera image signal processor (ISP), an input/output device, and the like.

As above, embodiments have been disclosed in the drawings and description. Embodiments have been described using specific terms in the description, but the embodiments are only used for the purpose of explaining the technical spirit of the present disclosure and are not used to limit meaning or scope of the present disclosure described in claims.

Thus, those skilled in the art will understand that various modifications and equivalent other embodiments are possible therefrom. Therefore, the true technical scope of protection of the present disclosure should be determined by the technical spirit of the appended claims.

What is claimed is:

1. A semiconductor package comprising:
a semiconductor chip including a semiconductor substrate having a first surface and a second surface opposite to the first surface;
a chip pad disposed on the first surface of the semiconductor substrate and comprising a conductive layer;
a support pad disposed on the first surface of the semiconductor substrate, spaced apart from the chip pad, and comprising an insulating layer;
a support bump connected to the support pad;
a wiring substrate disposed to face the semiconductor substrate;

a support bonding on trace (BOT) pad disposed on the wiring substrate and bonded to the support bump; and a dummy area disposed on the wiring substrate and spaced apart from the support BOT pad.

2. The semiconductor package of claim 1, wherein:

the first surface of the semiconductor substrate is an active surface, the second surface of the semiconductor substrate is an inactive surface, and the support pad comprises a photo sensitive resist layer.

3. The semiconductor package of claim 1, wherein the dummy area comprises a conductive layer.

4. The semiconductor package of claim 1, wherein the dummy area comprises an insulating layer.

5. The semiconductor package of claim 1, wherein the support BOT pad is part of a linear trace pattern extending in a first direction in a plane on the wiring substrate.

6. The semiconductor package of claim 5, wherein:

the linear trace pattern comprises a plurality of linear trace patterns, and the plurality of linear trace patterns are separated from each other by a plurality of separation areas.

7. The semiconductor package of claim 1, wherein:

the support BOT pad includes a first support BOT pad and a second support BOT pad, the first support BOT pad is a first part of a first linear trace pattern extending in a first direction in a plane on the wiring substrate, and the second support BOT pad is a second part of the first linear trace pattern, the second part being spaced apart from the first part.

8. The semiconductor package of claim 1, wherein:

the support BOT pad includes a first support BOT pad and a second support BOT pad, the first support BOT pad is part of a first linear trace pattern extending in a first direction in a plane on the wiring substrate the second support BOT pad is part of a second linear trace pattern that is spaced apart from the first linear trace pattern in a second direction perpendicular to the first direction and that extends in the first direction in a plane on the wiring substrate, and the first linear trace pattern and the second linear trace pattern are connected by connection patterns in the second direction.

9. The semiconductor package of claim 1, wherein the support BOT pad is part of a circular trace pattern forming a closed loop in a plane on the wiring substrate.

10. The semiconductor package of claim 1, wherein:

the support BOT pad includes a first support BOT pad and a second support BOT pad, the first support BOT pad is part of a first circular trace pattern forming a first closed loop in a plane on the wiring substrate, and the second support BOT pad is part of a second circular trace pattern forming a second closed loop in a plane on the wiring substrate.

11. A semiconductor package comprising:

a semiconductor chip including a semiconductor substrate having a first surface and a second surface opposite to the first surface;

a chip pad disposed on the first surface of the semiconductor substrate and comprising a conductive layer;

a support pad disposed on the first surface of the semiconductor substrate, spaced apart from the chip pad, and comprising an insulating layer;

a conductive bump connected to the chip pad;

a support bump connected to the support pad;

a wiring substrate disposed to face the semiconductor substrate;

a wiring bonding on trace (BOT) pad disposed on the wiring substrate and bonded to the conductive bump;

a support BOT pad disposed on the wiring substrate and bonded to the support bump; and a dummy area spaced apart from the support BOT pad on the wiring substrate and comprising a conductive layer, wherein the conductive bump is electrically connected to a wiring layer formed on the wiring substrate, and the support bump is not electrically connected to the wiring layer.

12. The semiconductor package of claim 11, wherein the support BOT pad is part of a linear trace pattern extending in a first direction in a plane on the wiring substrate.

13. The semiconductor package of claim 11, wherein:

the support BOT pad includes a first support BOT pad and a second support BOT pad, the first support BOT pad is a first part of a first linear trace pattern extending in a first direction in a plane on the wiring substrate, and the second support BOT pad is a second part of the first linear trace pattern spaced apart from the first part.

14. The semiconductor package of claim 11, wherein:

the support BOT pad includes a first support BOT pad and a second support BOT pad, the first support BOT pad is part of a first linear trace pattern extending in a first direction in a plane on the wiring substrate, and the second support BOT pad is part of a second linear trace pattern that is spaced apart from the first linear trace pattern in a second direction perpendicular to the first direction and that extends in the first direction in a plane on the wiring substrate.

15. The semiconductor package of claim 11, wherein the support BOT pad is part of a circular trace pattern forming a closed loop in a plane on the wiring substrate.

16. A semiconductor package comprising:

a semiconductor chip including a semiconductor substrate having a first surface and a second surface opposite to the first surface;

a chip pad disposed on the first surface of the semiconductor substrate and comprising a conductive layer;

a support pad disposed on the first surface of the semiconductor substrate, spaced apart from the chip pad, and comprising an insulating layer;

a conductive bump connected to the chip pad;

a support bump connected to the support pad;

a wiring substrate disposed to face the semiconductor substrate;

a wiring bonding on trace (BOT) pad disposed on the wiring substrate and bonded to the conductive bump;

a support BOT pad disposed on the wiring substrate and bonded to the support bump; and a dummy area disposed on the wiring substrate and spaced apart from the support BOT pad, wherein the support BOT pad is part of a first linear trace pattern extending in a first direction in a plane on the wiring substrate, and wherein the dummy area is spaced apart from the first linear trace pattern and surrounds the first linear trace pattern in a plane on the wiring substrate.

17. The semiconductor package of claim 16, wherein the dummy area comprises a conductive layer or an insulating layer.

18. The semiconductor package of claim 16, further comprising a second linear trace pattern that is spaced apart from the first linear trace pattern in a second direction perpendicular to the first direction and that extends in the first direction in a plane on the wiring substrate, wherein the dummy area is spaced apart from the first linear trace pattern and the second linear trace pattern and surrounds the first linear trace pattern and the second linear trace pattern in a plane on the wiring substrate.

19. The semiconductor package of claim 18, further comprising a connection pattern disposed to connect the first linear trace pattern to the second linear trace pattern, wherein the first linear trace pattern, the second linear trace pattern, and the connection pattern form a closed loop.

20. The semiconductor package of claim 18, wherein:

the support bump includes a plurality of support bumps, the support BOT pad includes a plurality of support BOT pads, and the plurality of support BOT pads are spaced apart from each other and bonded to the plurality of support bumps, and the plurality of support BOT pads are formed on the first linear trace pattern and the second linear trace pattern.

\* \* \* \* \*